United States Patent [19]

Minakuchi

[11] Patent Number: 4,587,665
[45] Date of Patent: May 6, 1986

[54] BINARY COUNTER HAVING BUFFER AND COINCIDENCE CIRCUITS FOR THE SWITCHED BISTABLE STAGES THEREOF

[75] Inventor: Hiroshi Minakuchi, Shiga, Japan

[73] Assignee: Matsushita Electric Industrial Co., Ltd., Osaka, Japan

[21] Appl. No.: 542,195

[22] Filed: Oct. 14, 1983

[30] Foreign Application Priority Data

| Oct. 15, 1982 | [JP] | Japan | 57-181707 |
| Oct. 25, 1982 | [JP] | Japan | 57-187101 |
| Dec. 27, 1982 | [JP] | Japan | 57-231367 |
| Dec. 27, 1982 | [JP] | Japan | 57-231368 |
| Dec. 27, 1982 | [JP] | Japan | 57-231369 |

[51] Int. Cl.[4] .................. H03K 21/16; H03K 23/42; H03K 23/56
[52] U.S. Cl. .................. 377/116; 377/106; 377/121; 377/123
[58] Field of Search ............ 377/116, 117, 118, 119, 377/121, 106, 123; 307/448, 450, 452, 269, 480, 481, 272, 279

[56] References Cited

U.S. PATENT DOCUMENTS

3,894,246  7/1975  Torgrim .................. 307/480
4,012,697  3/1977  Ballinger ................ 307/480

FOREIGN PATENT DOCUMENTS

| 51-58056 | 5/1976 | Japan . |
| 51-35341 | 10/1976 | Japan . |
| 55-11022 | 3/1980 | Japan . |
| 56-36830 | 8/1981 | Japan . |
| 56-36831 | 8/1981 | Japan . |
| 56-36832 | 8/1981 | Japan . |
| 56-36833 | 8/1981 | Japan . |
| 56-36826 | 8/1981 | Japan . |
| 56-36827 | 8/1981 | Japan . |
| 56-36828 | 8/1981 | Japan . |
| 56-36829 | 8/1981 | Japan . |

Primary Examiner—John S. Heyman
Assistant Examiner—Karl Ohralik
Attorney, Agent, or Firm—Wenderoth, Lind & Ponack

[57] ABSTRACT

A binary counter consists of a plurality of unit stages each having a bistable circuit, a buffer circuit for generating an output corresponding to an output state of the bistable circuit, a switching circuit for supplying an output of the buffer circuit to the bistable circuit, and a coincidence gate for supplying a clock signal to the next unit stage in accordance with the predetermined output state of the bistable circuit.

7 Claims, 15 Drawing Figures

BINARY COUNTER HAVING BUFFER AND COINCIDENCE CIRCUITS FOR THE SWITCHED BISTABLE STAGES THEREOF

BACKGROUND OF THE INVENTION

1. Field of the Invention

The present invention relates to a binary counter which is used in digital systems.

2. Description of the Prior Art

U.S. Pat. No. 4,002,926 discloses a static binary counter (FIG. 4) and its unit stage in CMOS (FIG. 5). As is well known, a static counter needs a large chip area on the integrated circuit and consumes a large amount of power because of its complicated construction. On the other hand, a dynamic binary counter is commonly used, in the high frequency range of more than 10 KHz, because of its simple construction. However, it is difficult to construct digital systems using only the dynamic counters. An increase in power consumption necessitates an electrical power source of large capacity. Also, the lifetime of a source such as the dry battery in a portable instrument is shortened, and the high power consumption increases the amount of heat produced in the circuit components. This lowers the reliability of the instrument and also prevents miniaurization of the package into a onechip LSI.

SUMMARY OF THE INVENTION

An object of the present invention is to provide a binary counter having a small number of transistors and applicable to many digital systems as a programmable counter, an up-down counter, or a scaler.

A binary counter of the present invention consists of a plurality of unit stages each having a bistable circuit, a buffer means being supplied with an output signal from the bistable circuit, a switching means for transmitting an output signal from the buffer means to the bistable circuit, and a coincidence gate for supplying a clock signal to the next unit stage in accordance with the predetermined output state of the bistable circuit. The important feature of the present invention is that the coincidence gate in each unit stage generates the clock signal for the next unit stage. In other words, the function of triggering the next unit stage is separated from the function of producing the output of the stage. Thus, it is possible to preset the unit stage without any fear of after-triggerring the next unit stage, and, it is also possible to provide a high speed counter which operates up to higher frequency because of the clock transfer having a smaller delay time.

BRIEF DESCRIPTION OF THE DRAWINGS

The above and other objects and features of the present invention will become apparent from the following descriptions taken in connection with the accompanying drawings in which.

DESCRIPTION OF THE PREFERRED EMBODIMENTS

Figure 1:
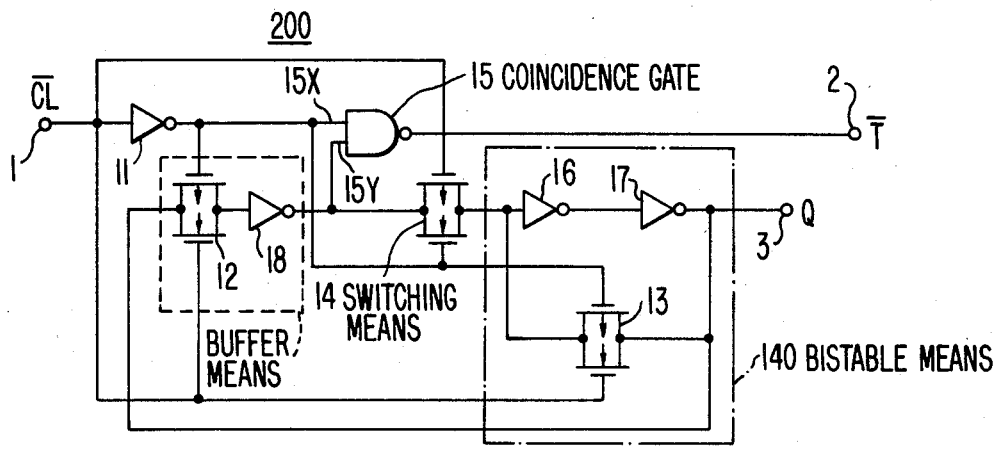
FIG. 1 is a circuit diagram of an embodiment of a unit stage according to the present invention.

Referring to FIG. 1 which shows a circuit diagram of a first embodiment of the present invention, the unit stage 200 of the binary counter comprises a clock signal input terminal 1 (CL means active low); a clock signal output terminal 2 (T meaning active Low) for the next unit stage; a stage output terminal 3; an inverter 11 which is connected to the clock signal input terminal 1; switches 12, 13 and 14 which are constructed of the parallel connection of a P-channel MOS transistor and a N-channel MOS transistor; NAND gate 15; and inverters 16, 17 and 18.

A bistable circuit 140 is constructed by the inverters 16 and 17 and a coupling loop for the inverters 16 and 17 through the switch 13 which turns to the closed state when the output level of the inverter 11 turns to a low "L" state. The switch 12 is connected between an output terminal of the inverter 17 and an input terminal of the inverter 18, and the switch 14 is connected between an output terminal of the inverter 18 and an input terminal of the inverter 16. Also, an input terminal of the bistable circuit 140 consists of the input terminal of the inverter 16, and an output terminal of the bistable circuit 140 consists of an output terminal of the inverter 17 which is connected to the stage output terminal 3. A first input terminal 15x of the NAND gate 15 is connected to an output terminal of the inverter 11, and a second input terminal 15y thereof is connected with the output terminal of the inverter 18. An output terminal of the NAND gate 15 is connected to the clock signal output terminal 2.

Figure 2:
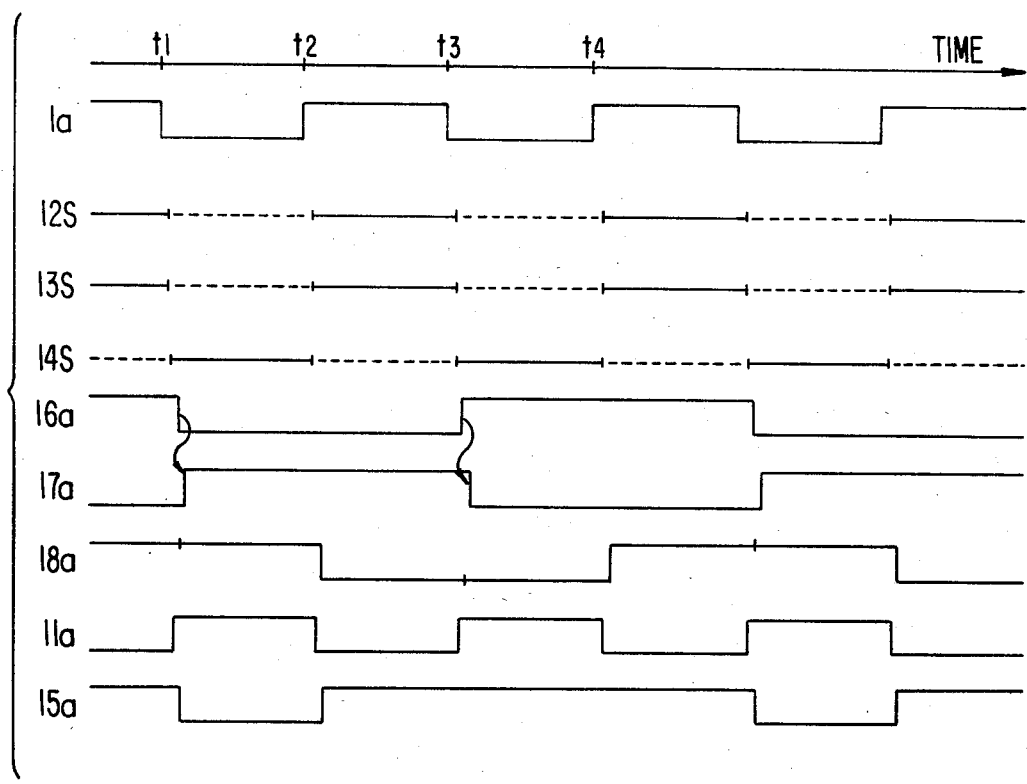
FIG. 2 is a time chart of each part shown in FIG. 1.

The operation of the unit stage as described above is visualized with reference to the time chart shown in FIG. 2. A clock signal represented by 1a in FIG. 2 is supplied to the clock signal input terminal 1. Switching timing states of the switches 12, 13 and 14 are as shown by 12s, 13s and 14s, respectively, wherein the solid line indicates the closed state and the broken line indicates the open state. Output signals of the inverter 16, 17, 18, 11, and the NAND gate 15 are as shown by 16a, 17a, 18a, 11a, and 15a respectively.

Before a time $t_1$, if the level of the clock signal 1a is a high "H" level and the output level of the inverter 17 is "L" (herein "H" means High-level, or "1", and "L" means Low-level, or "0"), the switches 12 and 13 are in the closed state and the switch 14 is in the open state, while the output levels of the inverter 18 and the NAND gate 15 are "H". At the time $t_1$, when the level of the clock signal $1a$ turns to "L", the switches 12 and 13 turn to the open state and the switch 14 turns to the closed state. Since the output of the inverter 18 is supplied to the input terminal of the inverter 16, the output level of the inverter 16 turns to "L", and accordingly the output level of the inverter 17 turns to "H" and the output level of the NAND gate turns to "L". At a time $t_2$, when the level of the clock signal $1a$ turns to "H", the switches 12 and 13 turn to the closed state and the switch 14 turns to the open state, so that the bistable circuit 140 maintains its output state. On the other hand, since the output of the inverter 17 is supplied to the input terminal of the inverter 18 through the switch 12, the output level of the inverter 18 turns to "L" and the output level of the NAND gate 15 turns to "H". At a time $t_3$, when the level of the clock signal $1a$ turns to "L", the switches 12, 13 and 14 and the inverter 11 repeat the same operation as at the time $t_1$. However, at this time, the NAND gate 15 does not change its output level.

In FIG. 1, the switch 12 and inverter 18 form the buffer means which is supplied with an output signal from the bistable circuit 140. The switch 14 forms the switching means for transmitting an output signal from the buffer means to the bistable circuit 140. The NAND gate 15 forms the coincidence gate for generating a clock signal for the next unit stage in accordance with the predetermined output state ("H" level output in this case) of the bistable circuit 140.

As described above, the binary counter of the present invention is featured by the construction of the unit stage 200 as shown in FIG. 1. Compared with conventional toggle-flip flops, the construction of the unit stage 200 is remarkably simplified. In other words, the number of elements and wiring is decreased. This result is especially beneficial for scaling down of the chip size and reducing the power consumption.

Furthermore, as is obvious from FIG. 2, since the switch 12 is held in the open-state from $t_1$ to $t_2$, the time interval from $t_1$ to $t_2$ is limited in the same fashion as that of the conventional dynamic counters because of the storage time of the capacitance at the input terminal of the inverter 18. However, in the present case, since the output of the NAND gate 15, which supplies the clock signal for the next unit stage, has the same interval of low-level duration from $t_1$ to $t_2$, the limitation is only applied against the clock signal for the first unit stage of the binary counter. Accordingly, the binary counter of the present invention can be employed in many digital systems as described hereinafter.

Figure 3:
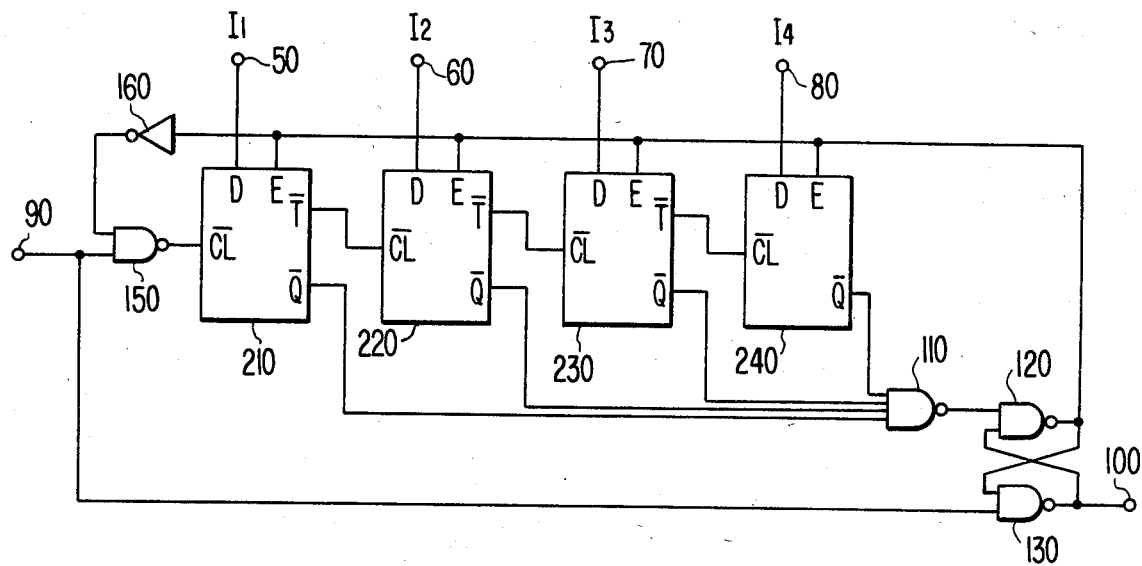
FIG. 3 is a circuit diagram of an embodiment of a scaler utilizing the present invention.
Figure 4:
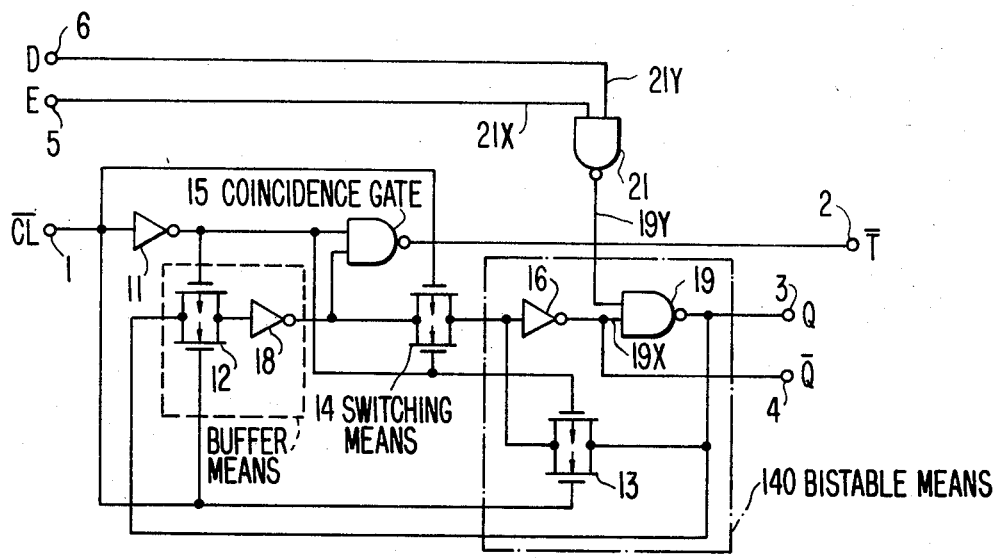
FIG. 4 is a circuit diagram of another embodiment of a unit stage according to the present invention.

FIG. 3 shows a four stage programmable scaler utilizing the present invention, and each of unit stages 210, 220, 230 are constructed as shown in FIG. 4 which is a modification of the unit stage 200 in FIG. 1. For the final unit stage 240 (MSB), another modified construction as shown in FIG. 5 may be used.

In FIG. 4, a NAND gate 19 is employed instead of the inverter 17 in FIG. 1. The output terminal of the inverter 16 is connected to a first input terminal 19x of the NAND gate 19 and an inverted stage output terminal 4, a second input terminal 19y of the NAND gate 19 is connected to an output terminal of an additional NAND gate 21, a first input terminal 21x of the NAND gate 21 is connected to a preset enable signal input terminal 5, and a second input terminal 21y of the NAND gate 21 is connected to a preset data input terminal 6. In FIG. 5, the bistable circuit is constructed of a pair of NAND gates 22 and 23. An output terminal of the NAND gate 23 is connected to a first input terminal 22x of the NAND gate 22 and an inverted stage output terminal 4, a first input terminal of the NAND gate 23 is connected to a clock signal input terminal 1, and a second input terminal 22y of the NAND gate 22 is connected to an output terminal of a NAND gate 24. A first input terminal 24x of the NAND gate 24 is connected with a preset enable signal input terminal 5, and a second input terminal 24y of the NAND gate 24 is connected to a preset data input terminal 6.

Referring now to FIG. 3, a four stage programmable scaler is constructed by the mutual connection of four unit stages 210, 220, 230 and 240, NAND gates 110, 120, 130 and 150, and an inverter 160. The NAND gate 110 detects the final count value [0000] ("0" means "L" as described already) of the down counter which is constructed by four unit stages 210–240. Then, the NAND gate 120 generates an preset enable signal for the unit stages 210–240, and the inverter 160 generates a clock disable signal for the NAND gate 150. At this time, each bit of program data at the data input terminals 50, 60, 70 and 80 is supplied to the preset data input terminal 6 of each of the unit stages 210–240, respectively, and the output level of the bistable circuit of the unit stage which is supplied with "H" level as a preset value turns to "H". However, even if the output level of the bistable circuit turns to "H" by the preset operation, the output level of the NAND gate 15 does not change, so it makes possible to preset without affecting the triggering operation for the next stage.

Figure 5:
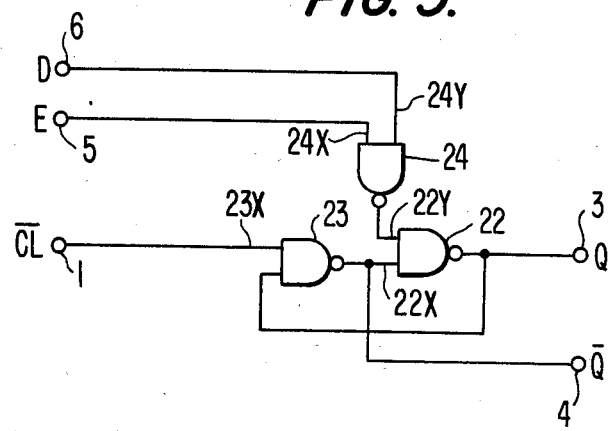
FIG. 5 is a circuit diagram of a final unit stage shown in FIG. 3.

Also, the construction of the counter shown in FIG. 5 contributes to the operation at high frequency. In the conventional way to construct a ripple counter, the clock signal for the next unit stage is supplied from the output terminal of the bistable circuit 140 as shown in FIG. 4. However, in the preset invention the clock signal for the next unit stage is supplied from the NAND gate 15 with a minimum delay time and it makes possible to operate at higher frequency.

Figure 6:
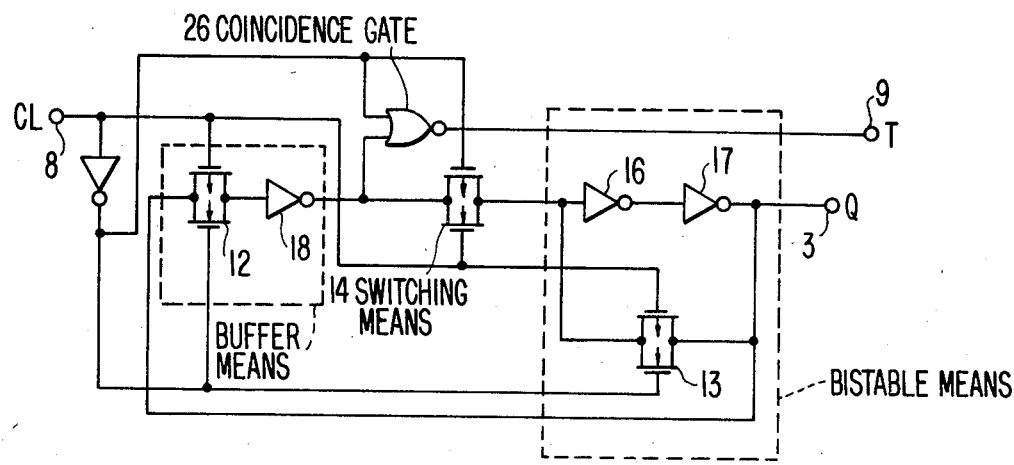
FIG. 6 is a circuit diagram of still another embodiment of a unit stage according to the present invention.
Figure 7:
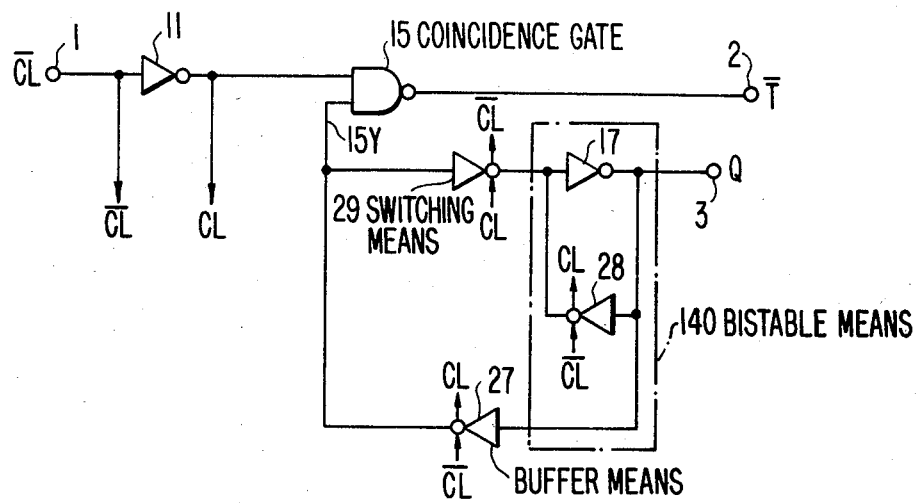
FIG. 7 is a circuit diagram of a further embodiment of a unit stage according to the present invention.
Figure 8:
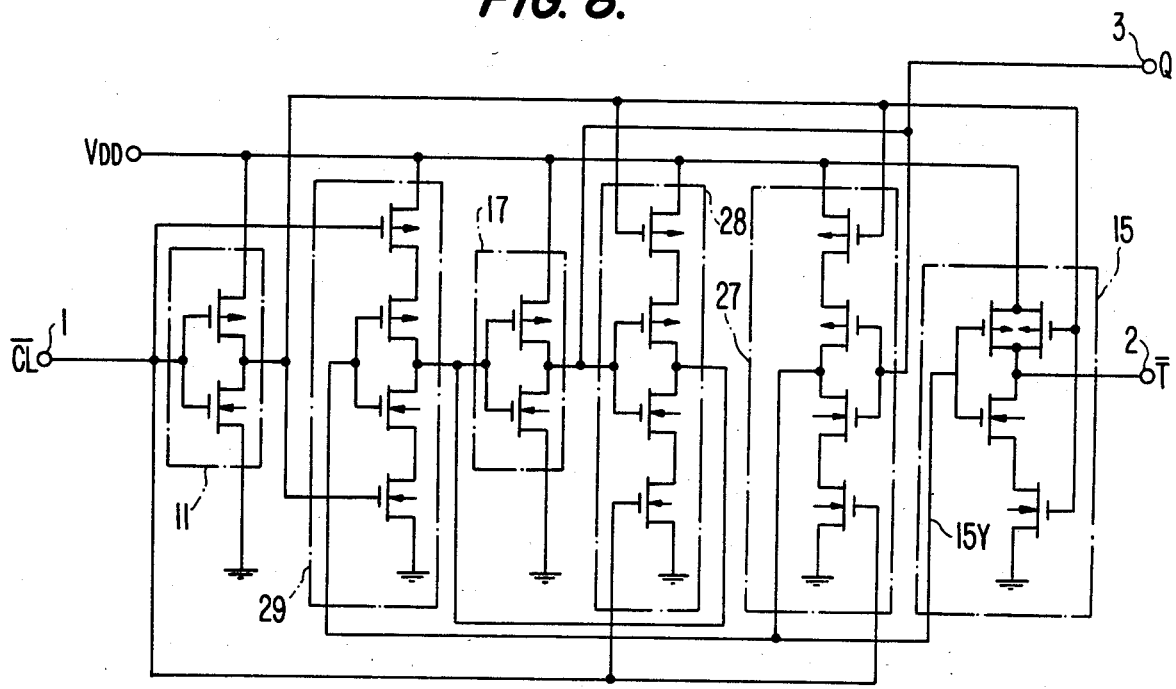
FIG. 8 is a detailed circuit diagram of the unit stage shown in FIG. 7.
Figure 9:
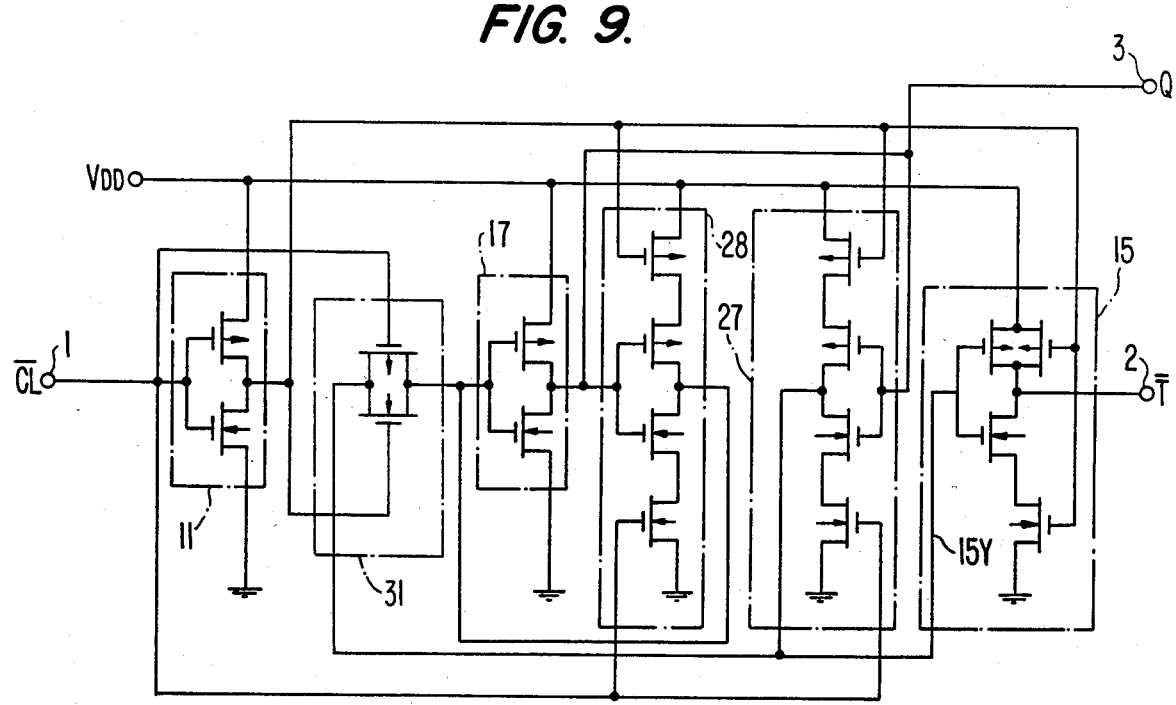
FIG. 9 is another detailed circuit diagram of a unit stage according to the present invention.

FIG. 6 shows another embodiment of the unit stage of the present invention, in which a NOR gate 26 is employed instead of the NAND gate 15 in FIG. 1. In FIG. 6, the active levels of clock signals at a clock signal input terminal 8 and a clock signal output terminal 9 are inverted with respect to those of the above case. FIG. 7 shows still another embodiment of the unit stage of the present invention, in which a first 3-state inverter 27 is employed instead of the switch 12 and the inverter 18 in FIG. 1, a second 3-state inverter 28 is employed instead of the switch 13 and the inverter 16, and a third 3-state inverter 29 is employed instead of the switch 14. FIG. 8 shows a practical circuit diagram of the unit stage shown in FIG. 7, which has a very simple construction. FIG. 9 shows a further embodiment of the unit stage of the present invention, in which a new switch 31 is employed instead of the 3-state inverter 29 in FIG. 8.

Figure 10:
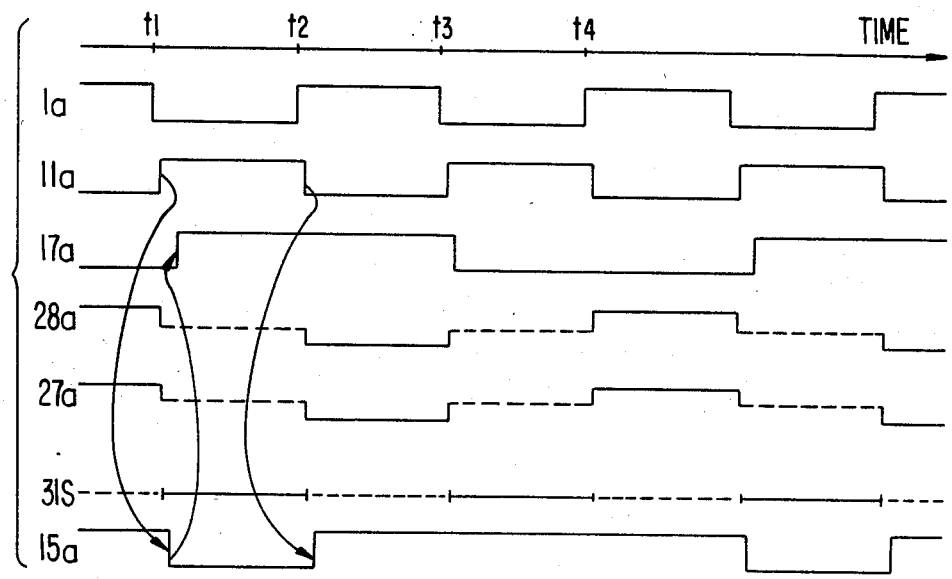
FIG. 10 is a time chart of each part shown in FIG. 9.

The operation of the unit stage as shown in FIG. 9 is visualized with reference to the time chart shown in FIG. 10. A clock signal represented by $1a$ in FIG. 10 is supplied to the clock signal input terminal 1. Output signals of the inverter 11, 17, and the NAND gate 15 are as shown by $11a$, $17a$, and $15a$, respectively. Switching timing states of the 3-state inverters 28, 27 are as shown by $28a$, $27a$, wherein the broken line indicates the high impedance output state, and a switching timing state of the switch 31 is as shown by 31s, wherein the broken line indicates the open state.

Before a time $t_1$, if the level of the clock signal 1a is "H" and the output level of the inverter 17 is "L", the switch 31 is open-state, while the output levels of the NAND gate 15 and the 3-state inverter 27, 28 are all "H". At a time $t_1$, when the level of the clock signal 1a turns to "L", the output level of the inverter 11 turns to "H", and as the result, the output states of the 3-state inverters 27 and 28 turn to the high impedance states. The switch 31 turns to the closed state, the output level of the NAND gate 15 turns to "L", and the output level of the inverter 17 turns to "H". At a time $t_2$, when the level of the clock signal 1a turns to "H", the output level of the inverter 11 turns to "L", and the output levels of the 3-state inverters 27 and 28 turn to "L". The switch 31 turns to the open state, and the output level of the NAND gate 15 returns to "H". At a time $t_3$, when the level of the clock signal 1a turns to "L", the output level of the inverter 11 turns to "H", and as the result, the output states of the 3-state inverters 27 and 28 turn to the high impedance states. The switch 31 turns to the closed state. At this time, since the level of an input terminal 15y of the NAND gate 15 is kept "L" by storage, the NAND gate 15 does not change its output level. As the result, by the transmission of an "H" level to an input terminal of the inverter 17, the output level of the inverter turns to "L". At a time $t_4$, when the level of the clock signal 1a turns to "H", the output level of the inverter 11 turns to "L", the output levels of the 3-state inverters 27 and 28 turn to "H", and the switch 31 turns to the open state, while the output levels of the NAND gate 15 and the inverter 17 do not change. Thereafter, the output level of the inverter 17 changes each time when the clock level changes to "L".

Figure 11:
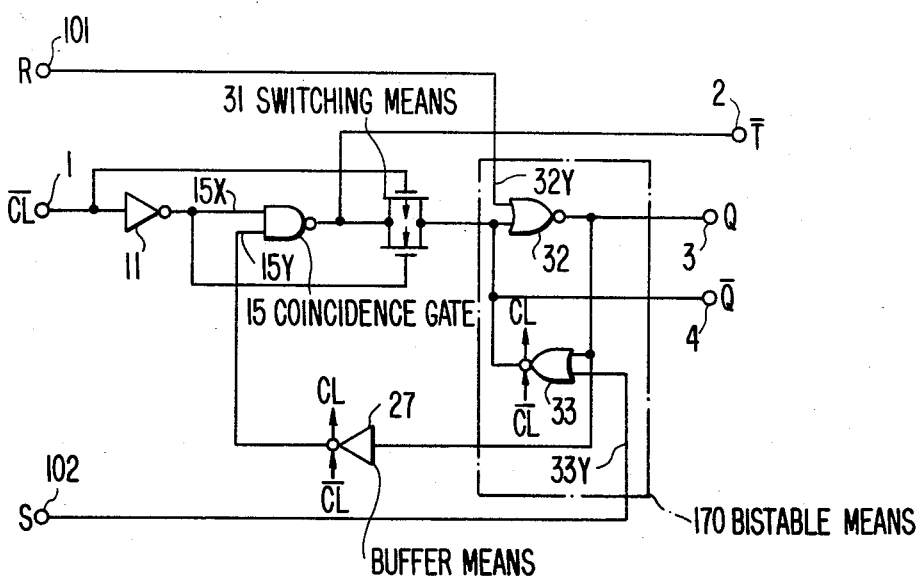
FIG. 11 is a circuit diagram of another embodiment of a unit stage utilizing the present invention.
Figure 12:
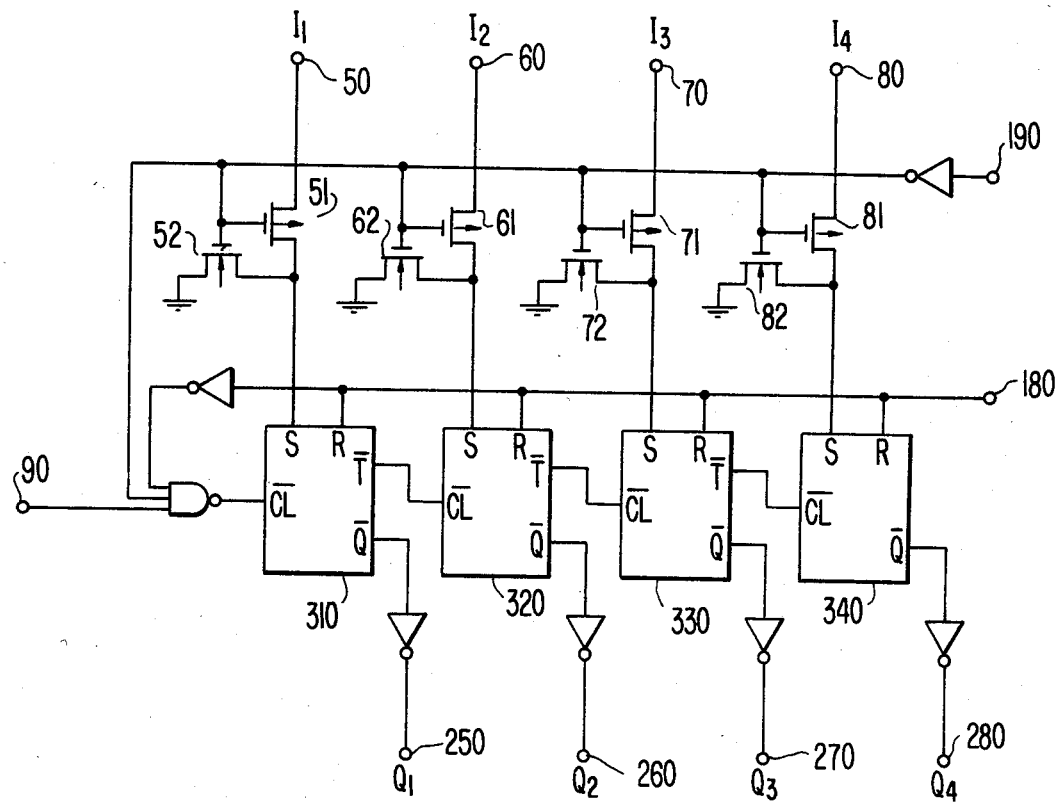
FIG. 12 is a circuit diagram of an embodiment of a programmable counter utilizing the present invention.

FIG. 11 shows further another embodiment of the unit stage of the present invention having a reset signal input terminal 101 and a preset signal input terminal 102. A bistable circuit 170 is constructed by a pair of NOR gate 32 and 3-state NOR gate 33. An input terminal 32y of the NOR gate 32 is connected to the reset signal input terminal 101, and an input terminal 33y of the 3-state NOR gate 33 is connected to the preset signal input terminal 102. FIG. 12 shows a programmable counter utilizing the unit stages which is shown in FIG. 11.

In FIG. 12, when an input level supplied to a reset terminal 180 turns to "H", an output value which appears at output terminals 250, 260, 270 and 280 of a four stage down counter constructed of the cascade connection of unit stages 310, 320, 330 and 340 becomes [0000]. When an input level supplied to a preset terminal 190 turns to "H", N channel MOS transistors 52, 62, 72 and 82 turn to the off state. At this time, the output level of the unit stage which receives an "H" level from preset data input terminals 50, 60, 70 and 80 turns to "H" because of the transconduction of the preset data through P channel MOS transistors 51, 61, 71 and 81. After the preset level returns to "L", the down counter starts to count down from a count value supplied to the preset data input terminals 50, 60, 70 and 80.

In FIG. 11 though the input terminal 15y of the NAND gate 15 is connected with the output terminal of the 3-state inverter 27, if an additional inverter is inserted between the output terminal of the 3-state inverter 27 and the input terminal 15x, a binary counter constructed by such unit stages can function as an up counter. In other words, it is possible to provide a simple up-down counter according to the present invention.

Figure 13:
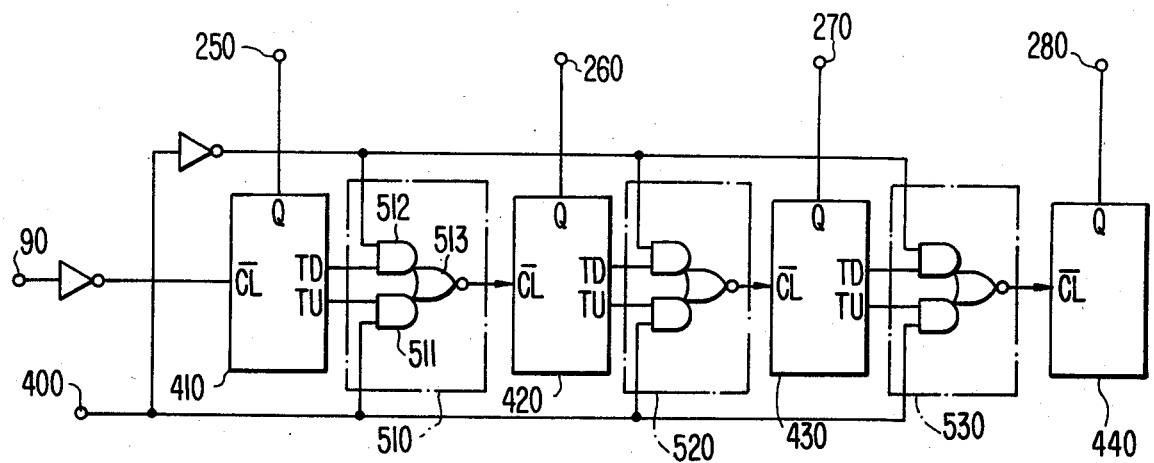
FIG. 13 is a circuit diagram of an embodiment of an up-down counter utilizing the present invention.

FIG. 13 shows a new type up-down counter having a plurality of unit stages 410, 420, 430 and 440, and a plurality of clock-change circuits 510, 520, 530 and 540. The clock-change circuit 510 is constructed by the connection of AND gates 511, 512 and a NOR gate 513, and circuits 520, 530 are the same. An input terminal 400 in FIG. 13 is an up-down change terminal. When an "H" level is supplied to the input terminal 400, the counter operates as an up counter, and when an "L" level is supplied to the input terminal 400, the counter operates as a down counter.

Figure 14:
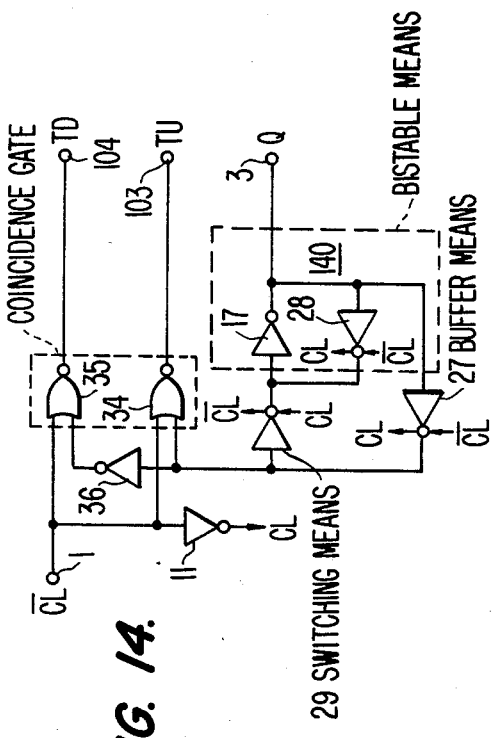
FIG. 14 is a circuit diagram of further another embodiment of a unit stage according to the present invention.

FIG. 14 shows the inner connection of each of the unit stages 410, 420 and 430, in which a NOR gate 34 is employed instead of the NAND gate 15 in FIG. 7 and supplies an up-clock signal to an up-clock terminal 103, and an additional NOR gate 35 and an additional inverter 36 are prepared for supplying a down-clock signal to a down-clock terminal 104. As the final unit stage 440 in FIG. 13, the simpler construction shown in FIG. 5 can be used. In FIG. 14, the NOR gate 34 is supplied with the inverted output signal of the bistable circuit 140 and the NOR gate 35 is supplied with the true (non-inverted) output signal. The clock level supplied to the clock input terminal 90 is kept "L". So, even if the level of the input terminal 400 is varied, the level of the up-clock terminal 103 or the down-clock terminal 104 does not change. Accordingly, it is possible to change the level of the input terminal in order to change over the count direction without any fear of causing a miss-count by keeping the "H" level of the clock level of the clock signal input terminal 1.

Figure 15:
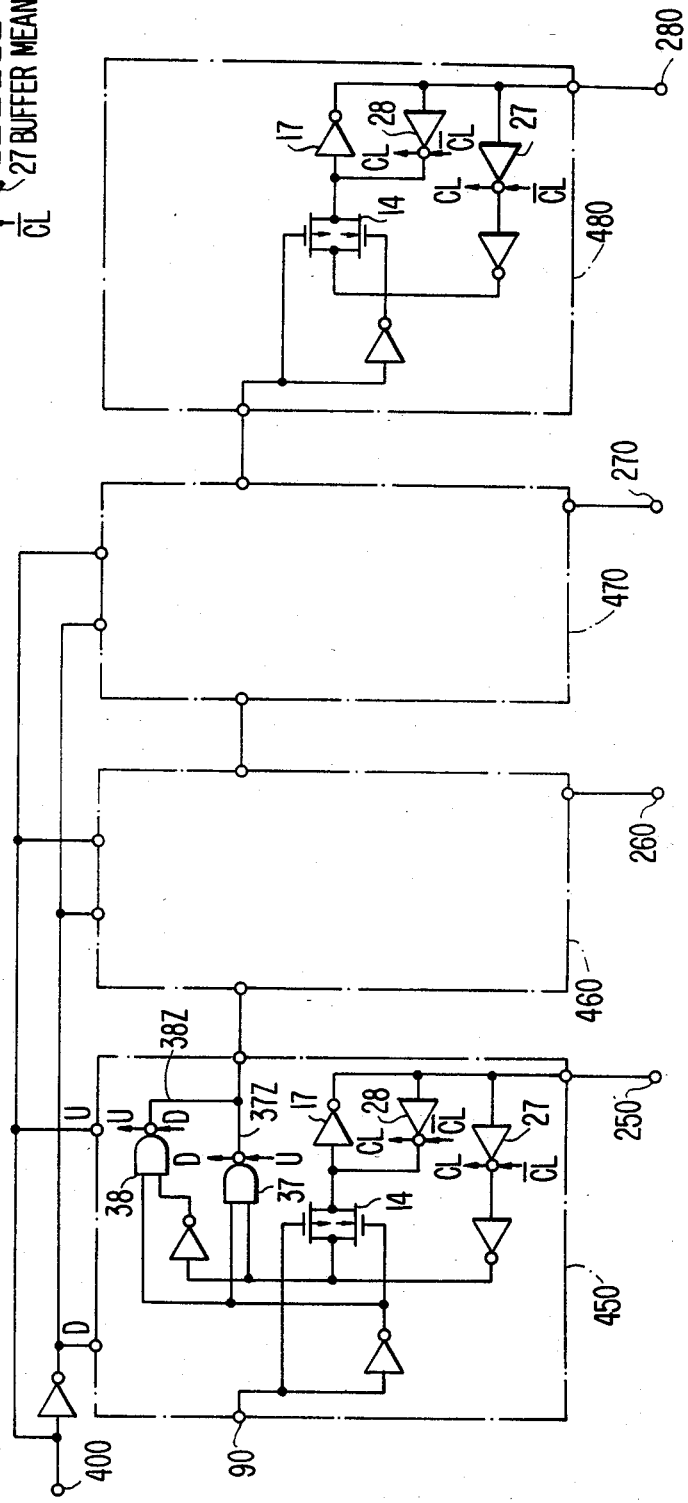
FIG. 15 is a circuit diagram of another embodiment of an up-down counter utilizing the present invention.

Furthermore, FIG. 15 shows yet another embodiment of an up-down counter utilizing the present invention, in which a 3-state NAND gate 37 is employed instead of the NOR gate 34 in FIG. 14, a 3-state NAND gate 38 is employed instead of the NOR gate 35, and an output terminal 37z of the 3-state NAND gate 37, an output terminal 38z of the 3-state NAND gate 38 and that mutual connection has a function as a clock change circuit shown in FIG. 13. Accordingly, it is not necessity to use the clock change circuits 510, 520 and 530 in FIG. 13.

It should be understood by a person skilled in the art that the above described embodiments are for explanation of the present invention, and that various changes and modifications are possible without departing from the scope of the present invention as claimed.

I claim:

1. A binary counter comprising a plurality of unit stages which are connected in series, each unit stage thereof comprising:
   an input terminal being supplied with a clock signal having first and second logical values;
   a bistable means coupled to said clock signal input terminal which maintains its output state by closing a coupling loop as a bistable circuit when said clock signal is of said first logical value;
   a buffer means coupled to said bistable means output and said clock signal input terminal for generating an output signal corresponding to an output state of said bistable means when said clock signal is of said first logical value;
   a switching means coupled between said buffer means and said bistable means for transmitting said output signal of said buffer means to said bistable means when said clock signal is of said second logical value;

a coincidence gate coupled to said buffer means output and said clock signal input terminal for generating an output signal corresponding to an output state of said bistable means and said logical value of said clock signal;

a means connected for supplying said output signal of said coincidence gate to an input terminal of said next unit state for use as a clock signal therefor.

2. A binary counter as claimed in claim 1, wherein said buffer means comprises: an inverter for supplying an output signal to said switching means and a second switching means for transmitting an output signal of said bistable means to said inverter.

3. A binary counter as claimed in claim 1, wherein said bistable means comprises an inverter and a first three-state inverter, and said buffer means comprises a second three-state inverter.

4. A binary counter comprising a plurality of unit stages which are connected in series, each unit stage thereof comprising:

an input terminal being supplied with a clock signal having first and second logical values;

a bistable means coupled to said clock signal input terminal which maintains its output state by closing a coupling loop as a bistable circuit when said clock signal is of said first logical value;

a buffer means coupled to said bistable means output and said clock signal input terminal for generating an output signal corresponding to an output stage of said bistable means when said clock signal is of said first logical value;

a switching means coupled between said buffer means and said bistable mans for transmitting said output signal of said buffer means to said bistable means when said clock signal is of said second logical value;

a coincidence gate coupled to said buffer means output and said clock signal input terminal for generating an output signal corresponding to an output state of said bistable means and said value of said clock signal;

a reset means coupled to said bistable means for supplying a reset signal to said bistable means;

a preset means coupled to said bistable means for supplying a preset signal to said bistable means after said reset signal has been supplied to said bistable means; and a means connected for supplying said output signal of said coincidence gate to an input terminal of said next unit stage for use as a clock signal;

wherein said bistable means comprises a second coincidence gate for generating an output signal of said bistable means and a third coincidence gate which effects bistable coupling with said second coincidence gate, said second and third coincidence gates each having first and second input terminals, and wherein said first and second input terminals of said second coincidence gate are supplied with an output signal from said third coincidence gate and said preset signal, and said first and second input terminals of said third coincidence gate are supplied with an output signal from said second coincidence gate and said reset signal.

5. A binary counter comprising a plurality of unit stages which are connected in series and a detecting means for generating a preset signal when a count value of said binary counter coincides with a predetermined value, each unit stage thereof comprising:

an input terminal being supplied with a clock signal having first and second logical values;

a bistable means coupled to said clock signal input terminal which maintains its output state by closing a coupling loop as a bistable circuit when said clock signal is of said first logical value;

a buffer means coupled to said bistable means output and said clock signal input terminal for generating an output signal corresponding to an output state of said bistable means when said clock signal is of said first logical value;

a switching means coupled between said buffer means and said bistable means for transmitting said output signal of said buffer means to said bistable means when said clock signal is of said second logical value;

a coincidence gate coupled to said buffer means output and said clock signal input terminal for generating an output signal corresponding to an output state of said bistable means and said value of said clock signal;

a preset means coupled to said bistable means for supplying a preset signal to said bistable means; and a means connected for supplying said output signal of said coincidence gate to an input terminal of said next unit stage for use as a clock signal;

wherein said bistable means comprises a second coincidence gate for generating an output signal of said for generating an output signal of said bistable means and an inverter which effects bistable coupling with said second coincidence gate, said second coincidence gate having first and second input terminals, and said first and second input terminals being supplied with an output signal from said inverter and said preset signal.

6. An up-down binary counter comprising a plurality of unit stages which are connected in series, each unit stage thereof comprising:

an input terminal being supplied with a clock signal having first and second logical values;

a bistable means coupled to said clock signal input terminal which maintains its output state by closing a coupling loop as a bistable circuit when said clock signal is of said first logical value;

a buffer means coupled to said bistable means output and said clock signal input terminal for generating an output signal corresponding to an output state of said bistable means when said clock signal is of said first logical value;

a switching means coupled between said buffer means and said bistable means for transmitting said output signal of said buffer means to said bistable means when said clock signal is of said second logical value;

a first coincidence gate coupled to said bistable means and said clock signal input terminal which is supplied with said clock signal and a true output signal from said bistable means;

a second coincidence gate coupled to said bistable means and said clock signal input terminal which is supplied with said clock signal and an inverted output signal from said bistable means;

a means connected for supplying said output signal from said first coincidence gate to an input terminal of said next unit stage for use as a clock signal when an up-count signal is of a first active value; and a means connected for supplying said output signal from said second coincidence gate to said input terminal of said next unit stage for use as a clock signal when a down-count signal is of a first active value.

7. An up-down binary counter comprising a plurality of unit stages which are connected in series, each unit stage thereof comprising:

an input terminal being supplied with a clock signal having first and second logical values;

a bistable means coupled to said clock signal input terminal which maintains its output state by closing a coupling loop as a bistable circuit when said clock signal is of said first logical value;

a buffer means coupled to said bistable means output and said clock signal input terminal for generating an output signal corresponding to an output state of said bistable means when said clock signal is of said first logical value;

a first switching means coupled between said buffer means and said bistable means for transmitting said output signal of said buffer means to said bistable means when said clock signal is of said second logical value;

a coincidence gate coupled to said bistable means and said clock signal input terminal having first and second input terminals, said gate being supplied with said clock signal and a true output signal from said bistable means;

a second switching means coupled between said bistable means and said coincidence gate for transmitting a true output signal from said bistable means to said second input terminal of said coincidence gate when an up-count signal is of a first active value; and a third switching means coupled between said bistable means and said coincidence gate for transmitting an inverted output signal from said bistable means to said second input terminal of said coincidence gate when a down-count signal is of a first active value.

* * * * *